United States Patent
Fischer et al.

(10) Patent No.: US 9,485,481 B2
(45) Date of Patent: Nov. 1, 2016

(54) LASER MODULE HAVING A DUOCHROMATIC LASER DIODE FOR A PORTABLE IMAGE PROJECTOR

(71) Applicant: Robert Bosch GmbH, Stuttgart (DE)

(72) Inventors: Frank Fischer, Gomaringen (DE); Gael Pilard, Wankheim (DE)

(73) Assignee: Robert Bosch GmbH, Stuttgart (DE)

( * ) Notice: Subject to any disclaimer, the term of this patent is extended or adjusted under 35 U.S.C. 154(b) by 165 days.

(21) Appl. No.: 14/401,468

(22) PCT Filed: Mar. 25, 2013

(86) PCT No.: PCT/EP2013/056299
§ 371 (c)(1),
(2) Date: Nov. 14, 2014

(87) PCT Pub. No.: WO2013/170988
PCT Pub. Date: Nov. 21, 2013

(65) Prior Publication Data
US 2015/0131059 A1 May 14, 2015

(30) Foreign Application Priority Data
May 15, 2012 (DE) .......... 10 2012 208 113

(51) Int. Cl.
*G03B 21/20* (2006.01)
*H04N 9/31* (2006.01)
*H01S 5/026* (2006.01)
(Continued)

(52) U.S. Cl.
CPC ........ *H04N 9/3161* (2013.01); *G03B 21/2033* (2013.01); *G06F 3/0423* (2013.01);
(Continued)

(58) Field of Classification Search
CPC .......... G03B 21/2013; G03B 21/2033; G03B 21/2066; H04N 9/3161; H04N 9/3164; H04N 9/3129; G02B 27/10; G02B 27/1006; G02B 27/14

USPC .............................. 353/94; 362/234; 359/629
See application file for complete search history.

(56) References Cited

U.S. PATENT DOCUMENTS

| 7,525,538 B2 | 4/2009 | Bathiche |
| 2009/0128717 A1 | 5/2009 | Nagashima et al. |

(Continued)

FOREIGN PATENT DOCUMENTS

| EP | 1411733 | 4/2004 |
| EP | 2120455 | 11/2009 |
| WO | WO2009/031094 | 3/2009 |

OTHER PUBLICATIONS

International Search Report for PCT/EP2013/056299, issued on Jul. 12, 2013.

*Primary Examiner* — William C Dowling
*Assistant Examiner* — Ryan Howard
(74) *Attorney, Agent, or Firm* — Norton Rose Fulbright US LLP

(57) ABSTRACT

A laser module is described for an image projection system, which has a duochromatic laser diode designed to generate a first beam bundle having laser light of a first wavelength and laser light of a second wavelength; a first collimating optics system designed to collimate the first beam bundle; at least one first monochromatic laser diode designed to generate a second beam bundle having laser light of a third wavelength; a second collimating optics system designed to collimate the second beam bundle; and a first optical combination device developed to combine the first and second beam bundles in order to form an output beam bundle of the laser module.

8 Claims, 1 Drawing Sheet

(51) Int. Cl.
*G06F 3/042* (2006.01)
*H01S 5/40* (2006.01)

(52) U.S. Cl.
CPC ........... *H01S 5/026* (2013.01); *H04N 9/3129* (2013.01); *H04N 9/3164* (2013.01); *H04N 9/3173* (2013.01); *H04N 9/3194* (2013.01); *G03B 21/2013* (2013.01); *H01S 5/4012* (2013.01); *H01S 5/4087* (2013.01); *H01S 5/4093* (2013.01)

(56) References Cited

U.S. PATENT DOCUMENTS

| | | | |
|---|---|---|---|
| 2009/0147224 A1* | 6/2009 | Kurozuka | H04N 9/3129 353/98 |
| 2010/0201895 A1 | 8/2010 | Golub | |
| 2011/0181553 A1 | 7/2011 | Brown et al. | |
| 2011/0249240 A1* | 10/2011 | Takahashi | G02B 3/10 353/33 |

* cited by examiner

LASER MODULE HAVING A DUOCHROMATIC LASER DIODE FOR A PORTABLE IMAGE PROJECTOR

FIELD OF THE INVENTION

The present invention relates to a laser module having a duochromatic laser diode for a portable image projector, to a portable image projector having such a laser module, and to a method for generating images using a portable image projector, especially in miniaturized image projectors that provide an interactivity functionality.

BACKGROUND INFORMATION

Micromirror systems play an increasing role in image projectors for portable applications such as Smartphones, cameras, PDAs or tablet PCs. Such image projectors are frequently based on raster scanning methods, in which adjustable micromirrors scan a laser beam across a predefined raster matrix.

Apart from the imaging laser beams, interactive applications additionally require a further laser beam, which is dispersed or reflected at input devices or body parts of a user in the environment of the image projector, and whose reflective component enables the recording of movements in the environment of the image projector. The printed publications US 2010/0201895 A1, US 2011/0181553 A1, and U.S. Pat. No. 7,525,538 B2 describe image projection systems featuring an interactivity functionality.

The publication WO 2009/031094 A1 describes a projection device having at least one laser beam source and a scanning device for scanning an external projection region within a projection cone using a laser beam source, the device including a detection device for detecting the presence of an eye of a living being in the projection cone, and a control device for reducing the projection intensity of the laser beam if an eye of a living being is detected, a limited region around the eye position being reduced in the projection intensity and an initial projection intensity outside the restricted region in the projection cone being maintained. The device includes three single laser beam sources for the colors red, green and blue in each case. For the detection, the device includes an infrared beam source, an infrared sensor and a suitable beam splitter to receive the reflected IR beams.

The publication US 2009/128717 A1 describes an image projection apparatus for displaying images on a projection surface by using laser beams of the three colors green, blue, red on a projection surface. The apparatus includes a laser device having a laser beam of one wavelength and a second laser device having two emitting laser beams of two laser waves having two of the three colors. The apparatus includes a synthesizing element that combines an optical path of the three laser beams, and a scanning device which transmits the combined laser beams, pixel by pixel, onto the projection surface in order to create an image.

There is demand for laser modules for image projectors and for methods for generating images using an image projector which are implementable in a cost-effective, efficient and space-saving manner and enable an interactivity functionality of the image projector.

SUMMARY

According to one aspect, the present invention provides a laser module for an image projection system, which has a duochromatic laser diode designed to generate a first beam bundle having laser light of a first wavelength and laser light of a second wavelength; a first collimating optics system designed to collimate the first beam bundle; at least one first monochromatic laser diode designed to generate a second beam bundle having laser light of a third wavelength; a second collimating optics system designed to collimate the second beam bundle; and a first optical combination device developed to combine the first and second beam bundles in order to form an output beam bundle of the laser module.

According to another aspect, the present invention provides an image projection system having a laser module according to the present invention, and a micromirror system, which has controllable micromirrors developed to project a beam bundle generated by the laser module onto a projection surface in order to create images.

According to another aspect, the present invention provides a method for creating images using an image projection system, especially an image projection system according to the present invention, the method including the steps of generating a first beam bundle having a laser beam of a first wavelength and a laser beam of a second wavelength with the aid of a duochromatic laser diode; of collimating the first beam bundle with the aid of a first collimating optics system, the collimating optics system being adjusted to the laser beam of the first wavelength; of generating at least one second beam bundle having a laser beam of a third wavelength using a monochromatic laser diode; of collimating the second beam bundle with the aid of a second collimating optics system, the collimating optics system being adjusted to the laser beam of the third wavelength; of combining the first and second beam bundles to form an output beam bundle, and of projecting the output beam bundle with the aid of a micromirror system in order to generate images on a projection surface.

It is an idea of the present invention to replace one of the laser diodes in a laser module having multiple monochromatic laser diodes with a duochromatic laser diode. In addition to a laser beam having a main wavelength, the duochromatic laser diode supplies a further laser beam having an auxiliary wavelength, both of which are bundled by the same collimating optics system to form a common beam. Via optical elements, this beam is then bundled with the laser beams of the other laser diodes, so that a multispectral laser light source is created that, in addition to the imaging laser beams of different wavelengths, provides a further laser beam for implementing an interactivity functionality.

A considerable advantage of this laser module is that the laser module makes more laser beams of different wavelengths available than required laser diodes. This makes it possible to reduce the required components and space of the laser module, which in turn can lower the production costs and is advantageous in miniaturizing an image projection system including the laser module.

In addition, optical elements such as a further collimating optics system are able to be saved, because the additional laser beam can be processed via the same optical components as the laser beam having the main wavelength from the duochromatic laser diode. Also, it is possible to omit additional optical elements such as dichroic mirrors, which optimizes the light yield of the laser module and thus its efficiency.

Another advantage is that the laser module needs to be adjusted only to the imaging laser beams, because the same collimating optics system also adjusts the additional laser beam within a certain precision scope. This considerably simplifies the adjustment and optical adaptation of the laser module.

Moreover, it is advantageous that the additional laser beam is able to be scanned across a projection surface simultaneously with the imaging laser beam, so that additional information about the exact position of the additional laser beam is inherently available in the image projection system. This information may be utilized to improve the accuracy and the precision of an interactivity functionality. The wavelengths of the imaging laser beams are able to be filtered with respect to the wavelength of the additional laser beam in the detection of interactive gestures or movements, which makes it possible to optimize the signal-to-noise ratio and thus the detection accuracy.

According to one specific embodiment of the laser module according to the present invention, the laser module moreover may have a second monochromatic laser diode, which is developed to generate a third beam bundle having laser light of a fourth wavelength, a third collimating optics system, which is developed to collimate the third beam bundle, and a second optical combination device, which is designed to combine the first, second and third beam bundle to form an output beam bundle of the laser module. This laser module may advantageously be developed as RGB module, which supplies a further laser beam for interactivity applications in addition to the imaging laser beams.

According to a further specific embodiment of the laser module of the present invention, the first, second and third collimating optics system may include two lenses in each case.

According to a further specific embodiment of the laser module of the present invention, the first, third and fourth wavelengths may lie in the visible optical range, and the second wavelength may lie in the infrared range. Infrared light is particularly suitable for implementing an interactivity functionality.

According to a further specific embodiment of the laser module of the present invention, the duochromatic laser diode may be housed in a TO package. In an advantageous manner such duochromatic laser diodes are miniaturized designs, which are easy to install in space-saving laser modules.

According to a further specific embodiment of the laser module of the present invention, the first and second optical combination devices may include dichroic mirrors.

According to a further specific embodiment of the laser module of the present invention, the first collimating optics system may be adjusted to collimate the laser light of the first wavelength. This ensures outstanding image quality for the image projection systems using the laser module, while a slight deviation from an optimal collimation for the additional laser beam is acceptable because of the lower required resolution of object positions and object movements.

According to one specific embodiment of the method of the present invention, the method may furthermore include the steps of detecting beams of the laser beam of the second wavelength that were reflected by objects situated in the vicinity of the projection surface, and of ascertaining object positions or object movements of the objects on the basis of the detected reflected beams. This makes it possible to implement an interactivity functionality.

According to a further specific embodiment of the method of the present invention, the method may furthermore include the steps of generating a third beam bundle having a laser beam of a fourth wavelength with the aid of a monochromatic laser diode, of collimating the third beam bundle with the aid of a third collimating optics system, the third collimating optics system being adjusted to the laser beam of the fourth wavelength, and of combining the first, second and third beam bundles to form an output beam bundle.

Additional features and advantages of specific embodiments of the present invention result from the following description with reference to the appended drawing.

The described embodiments and further refinements may be combined as desired provided that such combinations are useful. Additional possible embodiments, further refinements and implementations of the present invention also include combinations of features of the present invention not explicitly mentioned above or below with regard to the exemplary embodiments.

The enclosed drawings are intended to provide greater understanding of the specific embodiments of the present invention. They illustrate specific embodiments and serve to explain principles and concepts of the present invention in connection with the description. Other specific embodiments and many of the mentioned advantages result with regard to the drawings. The elements of the drawings are not necessarily drawn to scale relative to each other. Directional indications such as "left", "right", "above", "below", "over", "under", "next to" or the like in the following description are used merely for explanatory purposes and do not represent a restriction of the generality.

DETAILED DESCRIPTION

Image projection systems within the meaning of the present invention include all miniaturized projection systems based on a raster-scanning-type projection of locally bundled light beams. For example, image projection systems may include digital micromirror systems DMD, digital light processing systems DLP, spatial light modulators SLM, or similar systems. Such image projection systems can be used in portable or mobile devices, for example, such as in smartphones, mobile telephones, digital cameras, PDAs, tablet PCs, notebooks, laptops, navigation devices, electronic entertainment devices or similar items.

Figure 1:
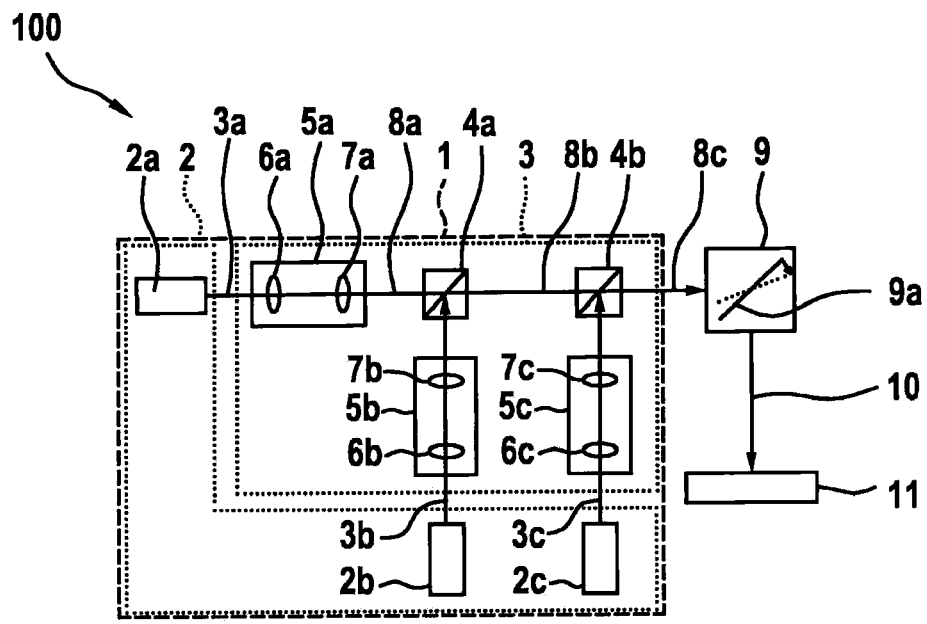
FIG. 1 a schematic representation of an image projection system according to a specific embodiment of the present invention.

FIG. 1 shows a schematic representation of an image projection system 100. Image projection system 100 includes a laser module 1, which emits bundled laser light 8c to a micromirror system 9 provided with micromirrors 9a. Micromirror system 9 may be actuated in such a way that bundled laser light 8c is scanned as scanning beam 10 across a projection surface 11 such as a monitor, a screen, a display or some other image display device, in the way of a matrix using a raster scanning method. Via this high-frequency actuation, an image or an image sequence that is optically visible to a viewer of projection surface 11 is able to be generated by scanning beam 10.

Laser module 1 includes a laser diode system 2 and an optical system 3. In the current example, laser diode system 2 includes three laser diodes 2a, 2b, 2c, of which first laser diode 2a is a duochromatic laser diode and the other two laser diodes 2b, 2c are monochromatic laser diodes. First laser diode 2a, for example, may be housed in a TO package ("transistor outline"). First laser diode 2a, for instance, is able to generate red visible laser light and infrared laser light, e.g., having wavelengths of 650 nm or 635 nm or 780 nm, and second and third laser diodes 2b, 2c may generate green and blue visible laser light such as 532 nm or 473 nm, for instance. In this way laser diode system 2 is able to provide visible RGB laser light and furthermore, infrared laser light for implementing the interactivity functionality.

Optical system 3 includes collimating optics systems 5a, 5b, 5c, which are assigned to one of laser diodes 2a, 2b or 2c in each case and are able to collimate their beam bundles 3a, 3b, 3c. For example, each collimating optics system 5a, 5b, 5c may have two lenses 6a, 7a or 6b, 7b or 6c, 7c and be adjusted to the visible laser light, so that the imaging laser beams, i.e., the visible laser beams, are collimated in an optimal manner. Because of the collimation of first beam bundle 3a to the laser light of the visible wavelength, the infrared laser light of duochromatic laser diode 2a is not optimally collimated on account of the chromatic aberration. This will make the spot size of the infrared laser light slightly larger in comparison with the visible laser light. For example, a typical spot size of the visible laser light may be 0.5 to 1.5 mm, while the typical spot size of the infrared laser light is approximately 2.5 to 3.5 mm. In addition, the infrared laser light is slightly offset along the optical axis in relation to the visible laser light. However, this is acceptable because the detection of interactive object positions or object movements usually requires considerably lower resolution than imaging with the visible light.

Using combination devices 4a, 4b, for example, collimated beam bundles 8a may be combined to form an output beam bundle 8b or 8c of laser module 1. Combination devices 4a, 4b, for instance, may be dichroic mirrors. Dichroic mirrors 4a, 4b may be transparent for infrared light, in particular.

Figure 2:
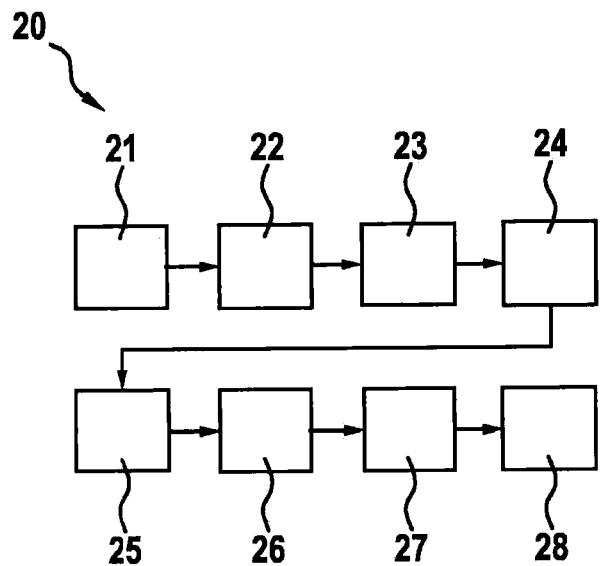
FIG. 2 a schematic representation of a method for generating images using an image projection system according to another specific embodiment of the present invention.

FIG. 2 shows a schematic illustration of a method 20 for generating images using an image projection system, especially an image projection system 100 such as shown in FIG. 1. As a first step 21, method 20 includes the generation of a first beam bundle 3a having a laser beam of a first wavelength and a laser beam of a second wavelength using a duochromatic laser diode 2a. Duochromatic laser diode 2a, for example, may generate red light in the visible range and infrared light, e.g., having the wavelength of 650 nm or 635 nm or 780 nm. In a second step 22, first beam bundle 3a is collimated with the aid of a first collimating optics system 5a, first collimating optics system 5a being adjusted to the laser beam of the first wavelength. In a third step 23, at least one second beam bundle 3b having a laser beam of a third wavelength is generated with the aid of a monochromatic laser diode 2b. For example, monochromatic laser diode 2b may generate green visible light or blue visible light. In a fourth step, second beam bundle 3b is collimated with the aid of a second collimating optics system 5b, second collimating optics system 5b being adjusted to a laser beam of the third wavelength.

Finally, in a step 25, first and second beam bundle 3a, 3b are combined to form an output beam bundle 8b or 8c, which is able to be projected with the aid of a micromirror system 9 to create images on a projection surface 11. Micromirror system 9 may be activated in a raster scanning method, for example, in order to achieve a matrix-type image structure with output beam bundle 8b or 8c.

It may optionally be provided to combine a third beam bundle 3c of a further monochromatic laser diode 2c with output beam bundle 8b to form an output beam bundle 8c, e.g., green visible light or blue visible light. This makes it possible to generate an output beam bundle 8c, which includes three-colored visible laser light (RGB laser light) and an additional laser beam of an additional frequency (e.g., infrared laser light).

Optionally, in a step 27, a detection of beams of the laser beam of the second wavelength may take place, which were reflected at objects situated in the vicinity of projection surface 11, so that it is possible to ascertain object positions or object movements of the objects on the basis of the detected reflected beams in an optional step 28.

What is claimed is:

1. A laser module for an image projection system, comprising:
   a duochromatic laser diode for generating a first beam bundle having laser light of a first wavelength and laser light of a second wavelength;
   a first collimating optics system for collimating the first beam bundle;
   at least one first monochromatic laser diode for generating a second beam bundle having laser light of a third wavelength;
   a second collimating optics system for collimating the second beam bundle;
   a first optical combination device for combining the first and second beam bundles to form an output beam bundle of the laser module;
   a second monochromatic laser diode for generating a third beam bundle having laser light of a fourth wavelength;
   a third collimating optics system for collimating the third beam bundle; and
   a second optical combination device for combining the first, second, and third beam bundles to form the output beam bundle of the laser module, wherein the first, third, and fourth wavelengths lie in a visible optical range, and the second wavelength lies in an infrared range.

2. The laser module as recited in claim 1, wherein the first, second, and third collimating optics systems include two lenses in each case.

3. The laser module as recited in claim 1, wherein the duochromatic laser diode is housed in a TO package.

4. The laser module as recited in claim 1, wherein the first and second optical combination devices include dichroic mirrors.

5. The laser module as recited in claim 1, wherein the first collimating optics system is adjusted to collimate the laser light of the first wavelength.

6. An image projection system, comprising:
   a laser module for an image projection system, the laser module including:
      a duochromatic laser diode for generating a first beam bundle having laser light of a first wavelength and laser light of a second wavelength,
      a first collimating optics system for collimating the first beam bundle,
      at least one first monochromatic laser diode for generating a second beam bundle laser light of a third wavelength,
   a second collimating optics system for collimating the second beam bundle,
      a first optical combination device for combining the first and second beam bundles to form an output beam bundle of the laser module,
   a second monochromatic laser diode for generating a third beam bundle having laser light of a fourth wavelength, a third collimating optics system for collimating the third beam bundle, and a second optical combination device for combining the first, second, and third beam bundles to form the output beam bundle of the laser module, wherein the first, third, and fourth wavelengths lie in a visible optical range, and the second wavelength lies in an infrared range; and a micromirror system including controllable micromirrors and for projecting the output beam bundle generated by the laser module onto a projection surface in order to generate an image.

7. A method for generating an image using an image projection system, the method comprising:
- generating a first beam bundle having a laser beam of a first wavelength and a laser beam of a second wavelength using a duochromatic laser diode;
- collimating the first beam bundle with the aid of a first collimating optics system, the first collimating optics system being adjusted to the laser beam of the first wavelength;
- generating at least one second beam bundle having a laser beam of a third wavelength with the aid of a monochromatic laser diode;
- collimating the second beam bundle with the aid of a second collimating optics system, the second collimating optics system being adjusted to the laser beam of the third wavelength;
- combining the first and second beam bundles to form an output beam bundle;
- projecting the output beam bundle with the aid of a micromirror system to generate the image on a projection surface;
- generating a third beam bundle having a laser beam of a fourth length with the aid of a monochromatic laser diode;
- collimating the third beam bundle with the aid of a third collimating optics system, the third collimating optics system being adjusted to the laser beam of the fourth wavelength; and
- combining the first, second, and third beam bundles to form an output beam bundle, wherein the first, third, and fourth wavelengths lie in a visible optical range, and the second wavelength lies in an infrared range.

8. The method as recited in claim 7, further comprising:
- detecting beams of the laser beam of the second wavelength reflected at objects situated in a vicinity of the projection surface; and
- ascertaining one of object positions and object movements of the objects on the basis of the detected reflected beams.

* * * * *